US012642064B2

(12) United States Patent
Summerfelt et al.

(10) Patent No.: US 12,642,064 B2
(45) Date of Patent: May 26, 2026

(54) THROUGH TRENCH ISOLATION FOR DIE

(71) Applicant: TEXAS INSTRUMENTS INCORPORATED, Dallas, TX (US)

(72) Inventors: Scott Robert Summerfelt, Garland, TX (US); Benjamin Stassen Cook, Los Gatos, CA (US); Sebastian Meier, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 311 days.

(21) Appl. No.: 17/710,139

(22) Filed: Mar. 31, 2022

(65) Prior Publication Data

US 2022/0384252 A1     Dec. 1, 2022

Related U.S. Application Data

(60) Provisional application No. 63/193,498, filed on May 26, 2021.

(51) Int. Cl.
H10D 62/10        (2025.01)
H01L 21/762       (2006.01)

(52) U.S. Cl.
CPC .. H01L 21/76232 (2013.01); H01L 21/76229 (2013.01); H10D 62/115 (2025.01)

(58) Field of Classification Search
CPC ... H01L 23/522–53295; H01L 27/1463; H01L 27/76224–76235
See application file for complete search history.

(56) References Cited

U.S. PATENT DOCUMENTS

| | | | |
|---|---|---|---|
| 5,767,562 | A | 6/1998 | Yamashita |
| 6,140,691 | A | 10/2000 | Gardner et al. |
| 6,225,664 | B1 | 5/2001 | Endo et al. |
| 6,534,379 | B1 | 3/2003 | Fisher et al. |
| 6,821,865 | B2 | 11/2004 | Wise et al. |

(Continued)

FOREIGN PATENT DOCUMENTS

CN        111725149 A  *  9/2020  ....... H01L 21/76898

OTHER PUBLICATIONS

Silicon Nitride MatWeb Material Property Data, https://www.matweb.com/search/DataSheet.aspx?MatGUID=e207e070ae9e4408861a8d40b6836fbf, accessed Jul. 30, 2024.*

(Continued)

*Primary Examiner* — Bryan R Junge
(74) *Attorney, Agent, or Firm* — Zhenhai Fu; Frank D. Cimino

(57) ABSTRACT

A device includes a die with a protective overcoat and a substrate, the substrate comprising a first region and a second region that are spaced apart. The device also includes an isolation dielectric between the protective overcoat and the die. A pre-metal dielectric (PMD) barrier is between the isolation dielectric and the substrate, the PMD barrier having a first region that contacts the first region of the substrate and a second region that contacts the second region of the substrate, the first region and the second region of the PMD barrier being spaced apart. A through trench filled with a polymer dielectric extends between the first region and the second region of the substrate, and between the first region and the second region of the PMD barrier to contact the isolation dielectric.

15 Claims, 13 Drawing Sheets

(56) References Cited

U.S. PATENT DOCUMENTS

| | | | | |
|---|---|---|---|---|
| 9,673,084 | B2 | 6/2017 | Liu et al. | |
| 2006/0275949 | A1 | 12/2006 | Farnworth | |
| 2008/0265364 | A1 | 10/2008 | Lerner et al. | |
| 2008/0277765 | A1 | 11/2008 | Lane | |
| 2009/0122651 | A1 | 5/2009 | Kupnik | |
| 2009/0224264 | A1* | 9/2009 | Feldtkeller | H01L 23/50 |
| | | | | 257/E21.546 |
| 2010/0038749 | A1 | 2/2010 | Summerfelt | |
| 2012/0020601 | A1 | 1/2012 | Li | |
| 2012/0038030 | A1 | 2/2012 | Frey | |
| 2014/0014986 | A1* | 1/2014 | Yoshida | H01L 27/156 |
| | | | | 257/91 |
| 2014/0042595 | A1 | 2/2014 | Schulze et al. | |
| 2015/0179735 | A1* | 6/2015 | In't Zandt | H01L 21/84 |
| | | | | 438/424 |
| 2015/0221692 | A1* | 8/2015 | Enomoto | H01L 27/14612 |
| | | | | 438/73 |
| 2016/0043120 | A1 | 2/2016 | Ahn | |
| 2017/0084628 | A1 | 3/2017 | Kim et al. | |
| 2017/0117356 | A1* | 4/2017 | Carothers | H01L 21/76224 |
| 2018/0174887 | A1 | 6/2018 | Chuang | |
| 2019/0206741 | A1 | 7/2019 | Poddar | |
| 2019/0326192 | A1 | 10/2019 | Eid | |
| 2020/0066768 | A1* | 2/2020 | Cheng | H01L 27/1464 |
| 2020/0203290 | A1 | 6/2020 | Summerfelt et al. | |
| 2020/0294939 | A1 | 9/2020 | Aleksov | |
| 2020/0411434 | A1* | 12/2020 | Nakashiba | H01L 23/291 |
| 2021/0013300 | A1 | 1/2021 | Lin | |
| 2021/0343641 | A1* | 11/2021 | Kuwabara | H01L 23/49503 |

OTHER PUBLICATIONS

Overview of Materials for Polyimide MatWeb Material Property Data, https://www.matweb.com/search/DataSheet.aspx?MatGUID= 0b1f084839774beaaeb6230b4ca7e06a&ckck=1, accessed Jul. 30, 2024.*

PCT Search Report dated Sep. 21, 2022.

Barnett: "Plasma dicing 300mm framed wafers—Analysis of improvement in die strength and cost benefits for thin die singulation"; 2017 IEEE 67th Electronic Components and Technology Conference (ECTC), 2017, pp. 343-349, doi: 10.1109/ECTC.2017.279; found on the internet at: https://ieeexplore.IEEE.org/abstract/document/7999714.

Bui, et al.: "Copper-Filled Through-Silicon Vias With Parylene-HT Liner"; IEEE Transactions on Components, Packaging and Manufacturing Technology, vol. 6, No. 4, Apr. 2016; found on the internet at: https://ieeexplore.IEEE.org/document/7404258.

Feng, et al.: "Methods to Reduce Thermal Stress for TSV Scaling ~TSV with Novel Structure: Annular-Trench-Isolated TSV~"; 2015 IEEE 65th Electronic Components and Technology Conference (ECTC), 2015, pp. 1057-1062, doi: 10.1109/ECTC.2015. 7159725 .; found on the internet at: https://ieeexplore.IEEE.org/abstract/document/7159725.

European Patent Office, Extended European Search report for T100877EP01, mailed Sep. 17, 2024, 11 pages.

Yin Hua Lei et al.: "A parylene-filled-trench technique for thermal isolation in silicon-based microdevices", Journal of Micromechanics and Microengineering, Institute of Physics Publishing, Bristol, GB, vol. 19, No. 3, Feb. 18, 2009 (Feb. 18, 2009), p. 35013, XP020153350, ISSN: 0960-1317, DOI: 10.1088/0960-1317/19/3/035013.

Yinhua Lei et al.: "Molecular effusion-boltzmann model for parylene C deposition in deep trench", Nano/Micro Engineered and Molecular Systems (NEMS), 2010 5TH IEEE International Conference On, IEEE, Piscataway, NJ, USA, Jan. 20, 2010 (Jan. 20, 2010), pp. 628-632, XP031918373, DOI: 10.1109/NEMS.2010.5592481 ISBN: 978-1-4244-6543-9.

European Patent Office, Extended European Search report for T100887EP01, Dec. 5, 2024, 8 pages.

* cited by examiner

THROUGH TRENCH ISOLATION FOR DIE

CROSS-REFERENCE TO RELATED APPLICATION

This application claims the benefit of priority to U.S. Provisional Application No. 63/193,498, filed on 26 May 2021 the entirety of which is herein incorporated by reference.

TECHNICAL FIELD

This description relates to dies. More particularly, this description relates to dies with a through trench for isolation between regions of the dies.

BACKGROUND

In electronics, a wafer (also called a slice) is a thin slice of semiconductor, such as a crystalline silicon (c-Si), used for the fabrication of integrated circuits (ICs). The wafer serves as the substrate for microelectronic devices built in and upon the wafer. A wafer undergoes many microfabrication processes, such as doping, ion implantation, etching, thin-film deposition of various materials and photolithographic patterning. Finally, the individual dies that include microcircuits are separated by wafer dicing and packaged as an integrated circuit.

Parylene is an organic polymer that includes hydrogen (H) and carbon (C) atoms. Parylene is hydrophobic and resistant to most chemicals. Coatings of parylene are often applied to electronic circuits and other equipment as electrical insulation, moisture barriers, or protection against corrosion and chemical attack. Parylene coatings are applied by chemical vapor deposition in an atmosphere of the monomer para-xylylene.

SUMMARY

A first example relates to a device that includes a die with a protective overcoat and a substrate, the substrate having a first region and a second region that are spaced apart. The device also includes an isolation dielectric between the protective overcoat and the die. A pre-metal dielectric (PMD) barrier is between the isolation dielectric and the substrate, the PMD barrier having a first region that contacts the first region of the substrate and a second region that contacts the second region of the substrate, the first region and the second region of the PMD barrier being spaced apart. A through trench filled with a polymer dielectric extends between the first region and the second region of the substrate, and between the first region and the second region of the PMD barrier to contact the isolation dielectric.

A second example relates to a method for forming a device. The method includes depositing a patterned coat of resist on a wafer. A metallization stack is on a first surface of the wafer, the metallization stack comprising a pre-metal dielectric (PMD) barrier and an isolation dielectric. The method also includes etching through trenches in the wafer and removing the coat of resist, such that the through trench protrudes into the isolation dielectric of the metallization stack. The method further includes depositing a polymer dielectric on a second surface of the wafer to fill the through trenches and singulating dies from the wafer, such that the dies include a through trench.

DETAILED DESCRIPTION

Figure 1:
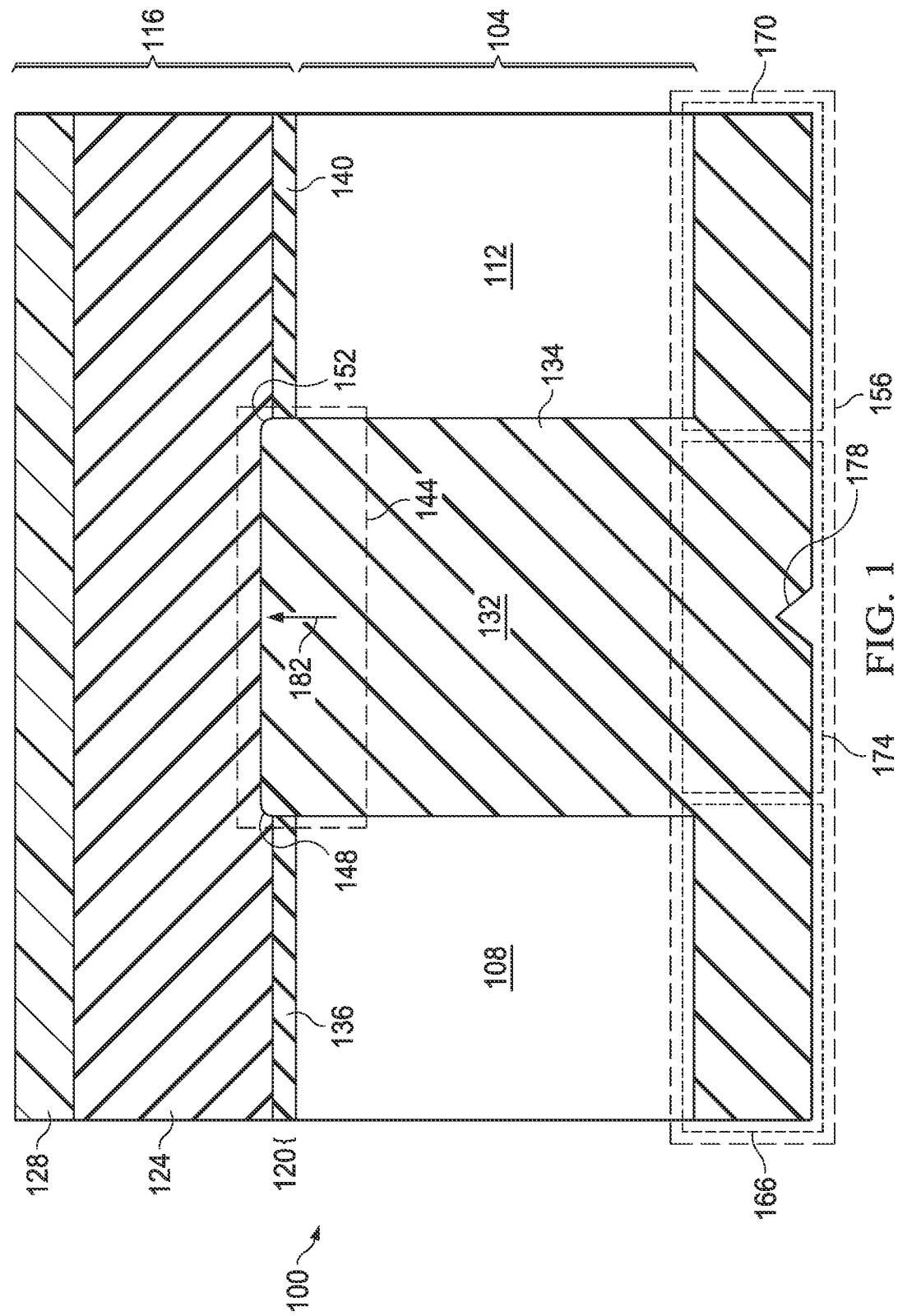
FIG. 1 illustrates a cross-section diagram of a region of a first example die employable for an integrated circuit (IC) packages.

This description relates to a die for an integrated circuit (IC) package (or a device, more generally). The die has been singulated from a wafer. The die has a metallization stack situated on a surface of the die. The metallization stack includes a protective overcoat (PO). The substrate includes a first region and a second region. The first region and the second region have circuit components embedded therein. Moreover, in some examples, the circuit components embedded in the first region have a first voltage rating and the circuit components in the second region have a second voltage rating, different from the first voltage rating. An isolation dielectric of the metallization stack is situated between the protective overcoat and the die, and a pre-metal dielectric (PMD) barrier of the metallization stack is situated between the isolation dielectric and the die. The PMD barrier has a first region that contacts the first region of the substrate and a second region that contacts the second region of the substrate. The first region and the second region of the PMD barrier and the substrate are spaced apart. The PMD barrier is formed of a material such as silicon nitride (SiN), and the isolation dielectric is formed of a material such as silicon dioxide ($SiO_2$).

A through trench filled with a polymer dielectric extends between the first region and the second region of the substrate, and between the first region and the second region of the PMD barrier to contact the isolation dielectric. The through trench filled with polymer dielectric electrically isolates the first region of the die and the second region of the die to avoid unwanted electromagnetic interference (EMI). In some examples, the through trench protrudes into the isolation dielectric. Moreover, in some examples, the through trench has rounded corners on an end that is proximate the isolation dielectric. The polymer dielectric is formed with a material such as parylene. The polymer dielectric filling the through trench has a greater coefficient of thermal expansion than the PMD barrier. Further, the isolation dielectric has a lower elastic modulus than the PMD barrier.

To singulate the die, the wafer is sawn into individual dies for device creation. In some examples, an instance of the individual die is employable in a product as-is such as in a wafer scale package with solder. In other examples, a bump bond between a die and product board is added to couple the die and the product board. In some examples, there is a thermal cycle involved to attach a die to the wafer scale package or the product board. For instance, for solder connections, the die is attached to the product board with a reflow process where the product board and the die are placed together and then heated above the melting temperature of the solder (e.g., about 250° C.). In some examples, this attachment process has a short time (e.g., about 5 seconds or less) at peak temperature and a fast cool rate (e.g., about 1 second per 5 degrees Celsius or more) as well.

In some examples, the multiple instances of the die, after singulation, are placed in a package with a protective plastic layer. In this case, the die are then mounted on an interconnect (e.g., a lead frame). In some examples, an additional wire connection is employed (wire bond) to electrically couple the die to the interconnect. In other examples, the mounting between the die and the interconnect is the electrical connection (bump or solder bonding). In examples where wire bonding is employed, the die attach is an insulating layer (epoxy like compound sometimes with added ceramic fillers), a conductive material, such as silver (Ag) filled epoxy, etc. Responsive to mounting the die on the interconnect (and attaching the wires, in some examples), the die and the interconnect are encased in a molding (e.g., plastic) to form the IC package.

In some examples, these IC package formation operations (or some subset thereof) include a thermal anneal which is between about 100° C. and about 200° C. The first thermal anneal is employed to attach the die to the interconnect (e.g., lead frame). Also, in some examples, to mount the formed IC package, the IC package is soldered to the product board using the before mentioned reflow process.

As noted, the isolation dielectric has a lower elastic modulus than the PMD barrier and also a larger thermal expansion coefficient. The isolation dielectric elastic modulus also has a temperature coefficient where the stiffness is reduced at higher temperatures such as during the annealing of the IC package and during the reflow than at ambient temperature (e.g., 0° C. to 32° C.). Thus, a force applied by the polymer dielectric filling the through trench due to thermal expansion causes the isolation dielectric to slightly deform. This deformation allows the polymer dielectric to partially compress the isolation dielectric and reduces a transfer of force on the PO. Accordingly, force in on the PO due to thermal expansion of the polymer dielectric filling the through trench is curtailed. Curtailment of this force reduces the chances that components of the metallization stack will crack during solder reflow or another time that the die is heated.

FIG. 1 illustrates a cross-section diagram of a region of a die 100 employable for an integrated circuit (IC) package (a device). The die 100 has been singulated from a wafer. The die 100 includes a substrate 104. The substrate 104 is formed of a semiconductor material such as silicon (Si), in some examples. The substrate 104 includes a first region 108 and a second region 112. A metallization stack 116 overlays the substrate 104. The metallization stack 116 includes a pre-metal dielectric (PMD) barrier 120, an isolation dielectric 124 and a protective overcoat (PO) 128. In some examples, there are additional layers between the PMD barrier 120 and the substrate which include silicon dioxide ($SiO_2$) in such examples. In some cases the metallization is based on Aluminum metal layers with Tungsten (W) Via layers or contact to Si. In other cases the metallization is copper with vias of the same material. The contact is likely Tungsten, Copper, Ruthenium or another conductive layers. The metallization layers might have diffusion barriers or adhesion layers like Ti, TiN, Ta, TaN, TiAl or TiAlN.

The PMD barrier 120 contacts the substrate 104, the isolation dielectric 124 overlies the PMD barrier 120 and the PO 128 overlies the isolation dielectric 124. In such a situation, the PO 128 protects the metallization stack 116 from exposure to the environment except for exposed metal pads which are not shown. The isolation dielectric 124 includes a PMB barrier. In some examples, the PMD barrier 120 is formed of silicon dioxide ($SiO_2$) based material such as phosphorous silicate glass (PSG) or boron phosphorous silicate glass (BPSG). The PMD barrier 120 underlies this portion of the isolation dielectric 124 (the PMD layer), and this PMD barrier 120 includes materials such as silicon nitride (SiN), silicon oxynitride (SiON) and other silicon dioxide ($SiO_2$) layers in some examples. In other examples, the isolation dielectric 124 is formed with SiN, fluorine doped $SiO_2$ or a low-K dielectric, such as silsesquioxane [$RSiO_{3/2}$].

The first region 108 and the second region 112 contain circuit components (e.g., transistors, resistors, capacitors, etc.) formed with standard processing techniques. The first region 108 and the second region 112 are spaced apart by a through trench 132. The through trench 132 provides dielectric isolation between the first region 108 and the second region 112 of the substrate 104. In this manner, the first region 108 and the second region 112 can have different power domains. As one example, the first region 108 has a high supply voltage (e.g., 80 V or more), wherein some of the components integrated with the first region 108 are rated for the high supply voltage. Conversely, in this example, the second region 112 has a low supply voltage (e.g., 10 V or less), wherein components integrated with the second region 112 of the substrate 104 are rated for the low supply voltage. Inclusion of the through trench 132 prevents unwanted EMI leaking and/or shorts between the two power domains.

The through trench 132 is filled with a polymer dielectric 134, such as parylene, including some of the functional groups of parylene, such as parylene-F, parylene-HT or parylene-AF4, parylene-VT4, parylene-N, or parylene-C. The polymer dielectric 134 filling the through trench 132 has a greater coefficient of thermal expansion than the PMD barrier 120. Stated differently, the polymer dielectric 134 filling the through trench 132 has a first coefficient of thermal expansion and the PMD barrier 120 has a second coefficient of thermal expansion, and the first coefficient of thermal expansion is greater than the second coefficient of thermal expansion.

Also, in some examples, the isolation dielectric 124 has a lower elastic modulus than the PMD barrier 120 formed of a material such as silicon nitride (SiN), silicon oxynitride (SiON) or silicon carbon oxynitride (SiCON). Stated differently, the isolation dielectric 124 has a first elastic modulus, and the PMD barrier 120 has a second elastic modulus, greater than the first elastic modulus. The elastic modulus of a material (e.g., the isolation dielectric 124 and the PMD barrier 120) characterizes the material's ability to resist being deformed elastically (e.g., non-permanently) when a stress is applied to the material. In examples where the die 100 is heated, the different materials forming the die 100 attempt to expand based on their respective coefficients of thermal expansion. In some examples, the materials are constrained by surrounding materials, and therefore experience force which the materials of the die 100 also apply to the surrounding materials. In examples where the polymer dielectric 134, in the trench 132 has a greater coefficient of thermal expansion than the substrate 104, the polymer dielectric 134 expands more than the substrate 104 and therefore applies stress away from the trench 132. If there is a stiff layer (greater elastic modulus) near the trench 132 then the stress is greater in this layer than nearby.

The PMD barrier 120 includes a first region 136 and a second region 140. The first region 136 of the PMD barrier 120 contacts the first region 108 of the substrate 104 and the second region 140 contacts the second region 112 of the substrate 104. Also, the first region 136 and the second region 140 of the PMD barrier 120 are spaced apart. More particularly, a region of the PMD barrier 120 has been etched away.

A first end 144 of the through trench 132 is proximate the isolation dielectric 124. The first end 144 extends in a first direction. The first end 144 includes a first corner 148 and a second corner 152. The first corner 148 and the second corner 152 are rounded corners with a radius of curvature of about 0.01 micrometers (μm) to about 0.2 μm. Unless otherwise stated, in this description, 'about' preceding a value means+/–10 percent of the stated value. The through trench 132 is formed such that the polymer dielectric 134 filling the through trench 132 protrudes beyond the PMD barrier 120 and into a region of the isolation dielectric 124.

The through trench 132 also includes a second end 156 that opposes the first end 144. The second end 156 is distal to the isolation dielectric 124. The second end 156 includes a first region 166 and a second region 170 that extend perpendicular to the first direction. Moreover, the first region 166 of the second end 156 of the through trench 132 underlies the first region 108 of the substrate 104. Similarly, the second region 170 of the second end 156 of the through trench 132 underlies the second region 112 of the substrate 104. The second end 156 of the through trench 132 further includes a third region 174 between the first region 166 and the second region 170. The third region 174 of the second end 156 opposes the portion of the first end 144 that protrudes beyond the PMD barrier 120 and into the isolation dielectric 124. In some examples, the third region 174 of the second end 156 includes a notch 178 (e.g., a void) from polymer dielectric 134 flowing through the through trench 132.

During fabrication of an IC package, the die 100 needs to survive many thermal cycles depending on the packaging process. The broad outlines for an example packaging process includes wafer scale encapsulation, gold (Au) solder bump, wire bond package in plastic with solder attach to printed circuit board (PCB), bump process to an interconnect (e.g., lead frame) with plastic package with solder attach to the PCB. In examples where the solder attachments are employed, the die 100 is heated to above solder reflow temperature which for common lead free solder is around 250° C. In some examples, this solder reflow temperature is the greatest temperature reached during the packaging process. Heating of the die 100 causes components of the die 100 to expand. However, as noted, the polymer dielectric 134 filling the through trench 132 has a greater thermal coefficient of thermal expansion than the PMD barrier 120. In conventional approaches, the PMD barrier 120 extends over the through trench 132 (e.g., no portion is etched away). Thus, in this conventional approach, thermal expansion of the polymer dielectric 134 causes the PMD barrier 120 to apply force in the direction indicated by the arrow 182. In some cases, this force is large enough to create a crack which can grow through the other the layers or some subset thereof. The greater stiffness of the PMD barrier 120 compared to the materials around it concentrates the force and makes it easier to fail by cracking. This force (in the conventional approach) is transferred to the isolation dielectric 124, and again transferred to the PO 128, such that the PO 128 cracks in some instances.

In contrast to the conventional approach, because a portion of the PMD barrier 120 overlying the first end 144 of the through trench 132 has been etched away, thermal expansion of the polymer dielectric 134 filling the through trench 132 in a direction indicated by an arrow 182 does not apply a force (in that same direction) on the PMD barrier 120. Also, as noted, the isolation dielectric 124 has a lower elastic modulus than the PMD barrier 120. Thus, a force applied by the polymer dielectric 134 filling the through trench 132 in the direction of the arrow 182 due to thermal expansion causes the isolation dielectric 124 to slightly deform. This deformation allows the polymer dielectric 134 to partially compress the isolation dielectric 124 and reduces a transfer of force on the PO 128. Stated differently, because the isolation dielectric 124 is partially compressed by the thermal expansion of the polymer dielectric 134, the force applied by such thermal expansion of the polymer dielectric 134 is partially absorbed by the isolation dielectric 124, and this absorbed force is not transferred to the PO 128. Accordingly, force in the direction of the arrow 182 on the PO 128 due to thermal expansion of the polymer dielectric 134 filling the through trench 132 is curtailed. Curtailment of this force reduces the chances that components of the metallization stack 116 (including the PO 128) will crack during solder reflow or another time that the die 100 is heated.

Figure 2:
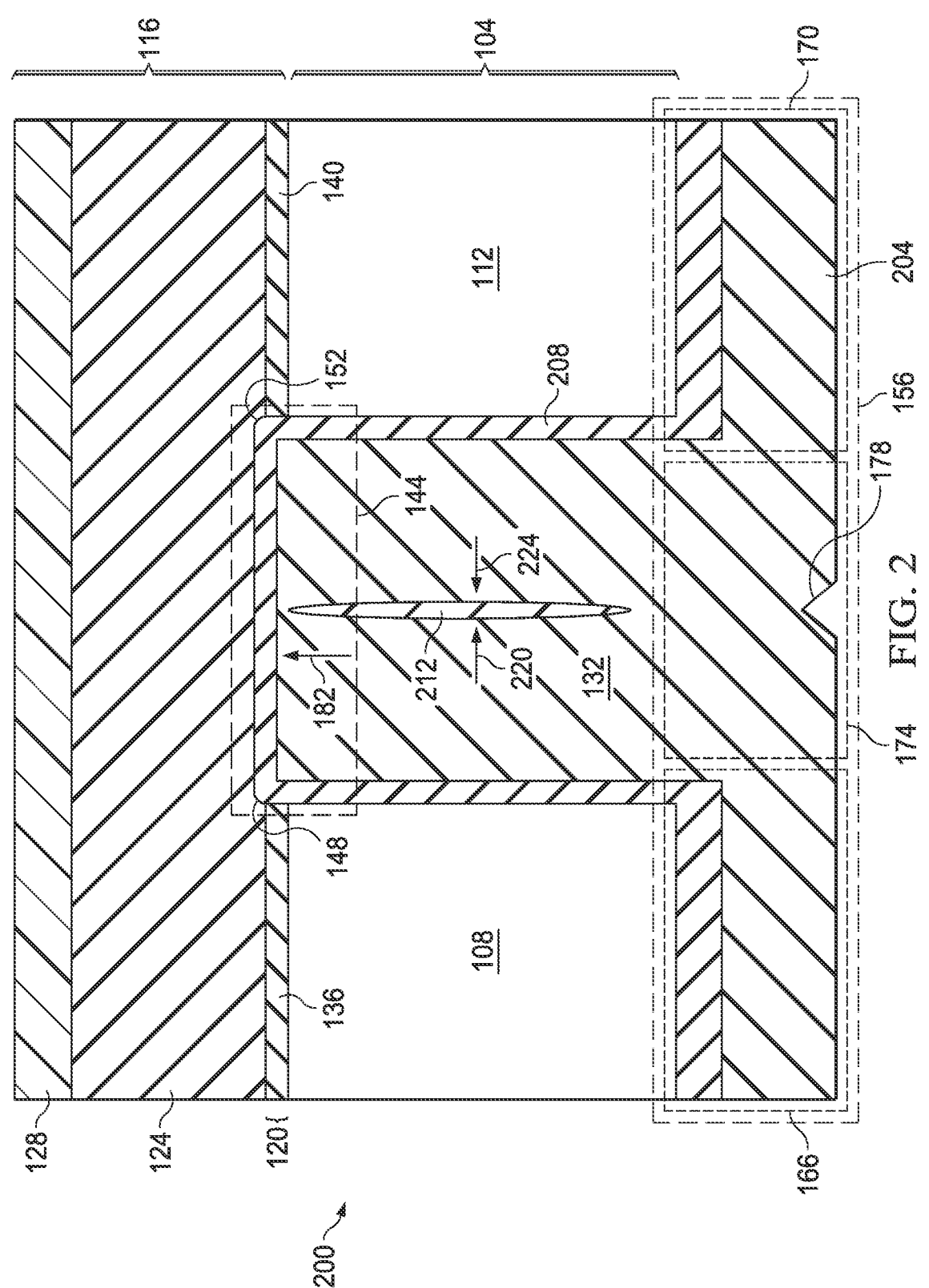
FIG. 2 illustrates a cross-section diagram of a region of a second example die employable for an IC package.

FIG. 2 illustrates a cross-section diagram of a region of a die 200 employable for an IC package. The die 200 has been singulated from a wafer, and is employable to implement the die 100 of FIG. 1. Thus, for simplicity, the same reference numbers are employed in FIGS. 1 and 2. Moreover, some features are not reintroduced.

In the example illustrated in FIG. 2, the through trench 132 is filled with a polymer dielectric 204 (e.g., Parylene) that is coated with a layer of silicon dioxide ($SiO_2$) or silicon nitride (SiN), which is referred to as a coating 208. The coating 208 is formed by plasma-enhanced chemical vapor deposition (PECVD) of the silicon dioxide ($SiO_2$); atomic layer deposition of SiO2 by pulsed deposition of Si containing organic such as TEOS with oxidizer such as H2O, O2, O3, plasma O2, N2O, etc.; chemical vapor deposition using TEOS+ozone to form SiO2; or PECVD, ALD or CVD of silicon nitride (SiN) prior to filling the remaining portion of the through trench 132 with the polymer dielectric 204; or CVD, ALD or PECVD of Al2O3. With few exceptions the, the coating 208 tapers from the second end 156 to the first end 144. That is, the thickness of the coating 208 is thickest at the second end 156 of the through trench 132 and is thinnest at the first end 144 of the through trench 132, such that the polymer dielectric 204 has a dovetail shape within the through trench 132. The polymer dielectric 204 improves the dielectric properties of the trench 132 and also increase the strength by increasing the thickness of the dielectric overlaying the trench 132. Another technique to create the trench shape is to use a substrate etch process where the diameter of the hole at the beginning of the hole 132 is narrower than in the middle or at the bottom of the hole. In some cases the hole is only wider at the bottom 144 near the PMD barrier 120.

Furthermore, the polymer dielectric 204 includes a void 212 form from the silicon dioxide (SiO₂) or silicon nitride (SiN) prior to filling the remaining portion of the through trench 132 with the polymer dielectric 204. The void 212 is an unfilled region of the through trench 132 that is circumscribed by the polymer dielectric 204.

To attach the die 200 to an interconnect, the die 200 is heated during a die attach bake. Heating of the die 200 causes components of the die 200 to expand. The polymer dielectric 204 has a greater thermal coefficient of thermal expansion than the PMD barrier 120. Because of the presence of the void 212, the polymer dielectric 204 expands in directions indicated by arrows 220 and 224 to fill the void 212. Also, force is generated in a direction indicated by the arrow 182. Because a portion of the PMD barrier 120 overlying the first end 144 of the through trench 132 has been etched away, thermal expansion of the polymer dielectric 204 filling the through trench 132 in a direction indicated by an arrow 182 has a reduced force (in that same direction) on the PMD barrier 120.

Also, a force applied by the polymer dielectric 204 filling the through trench 132 in the direction of the arrow 182 due to thermal expansion causes the isolation dielectric 124 to slightly deform. This deformation allows the polymer dielectric 204 to partially compress the isolation dielectric 124 and reduces a transfer of force on the PO 128. Also, the expansion of the polymer dielectric 204 in the direction indicated by the arrow 182 is reduced relative to the example illustrated in FIG. 1 because of the presence of the void 212 (which is compressed during the thermal expansion of the polymer dielectric 204). Accordingly, force in the direction of the arrow 182 on the PO 128 due to thermal expansion of the polymer dielectric 204 filling the through trench 132 is curtailed. Curtailment of this force reduces the chances that components of the metallization stack 116 (including the PO 128) will crack during solder reflow or another time that the die 200 is heated.

Figure 3:
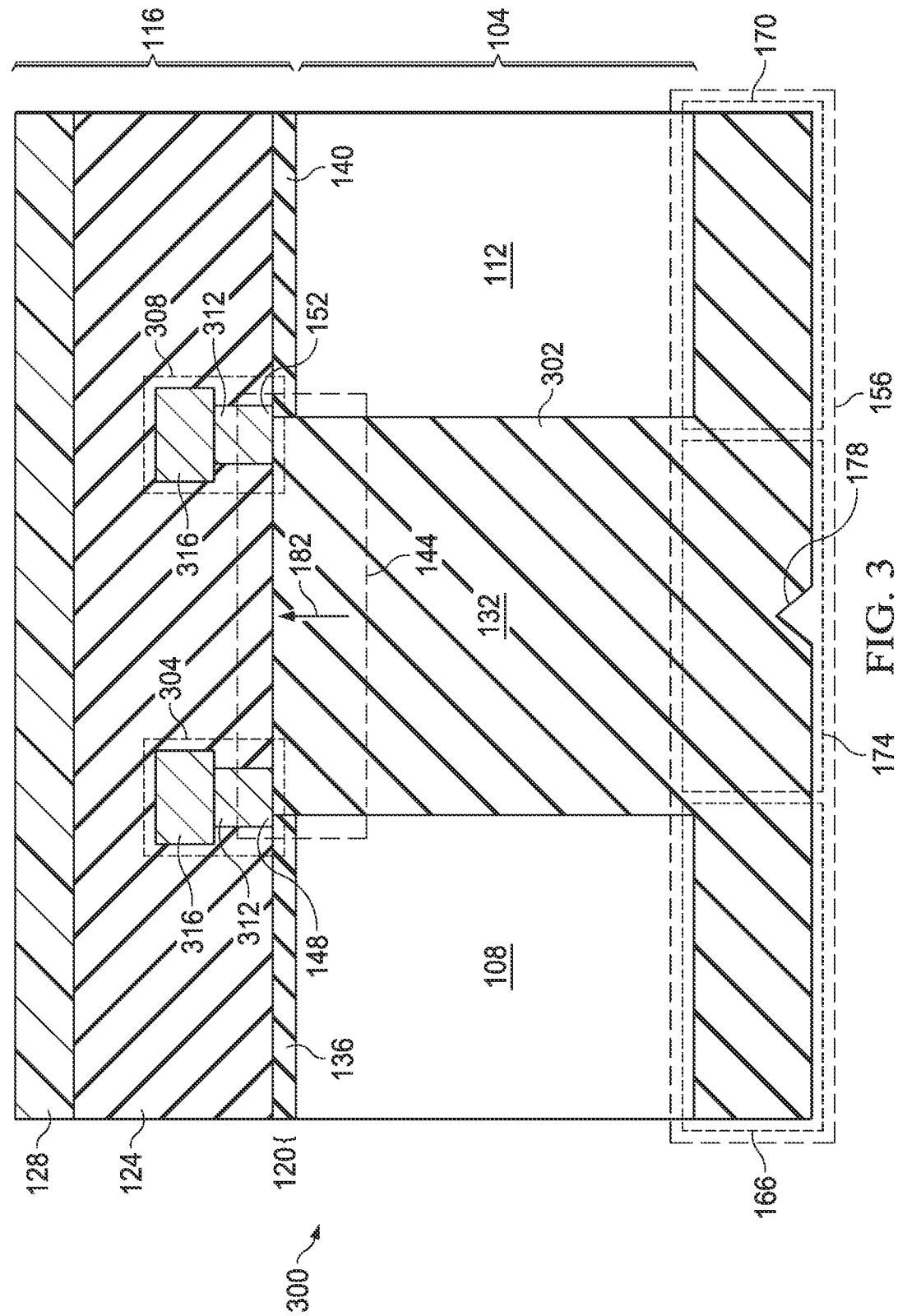
FIG. 3 illustrates a cross-section diagram of a region of a third example die employable for an IC package.

FIG. 3 illustrates a cross-section diagram of a region of a die 300 employable for an IC package. The die 300 has been singulated from a wafer, and is employable to implement the die 100 of FIG. 1. Thus, for simplicity, the same reference numbers are employed in FIGS. 1 and 3 to denote the same structure. Moreover, some features are not reintroduced.

In the example illustrated in FIG. 3, the through trench 132 is filled with a polymer dielectric 302 (e.g., parylene). A first contact 304 overlays and contacts the first corner 148 of the first end 144 of the through trench 132. Also, a second contact 308 overlays and contacts and the second corner 152 of the through trench 132.

The first contact 304 and the second contact 308 have a first region 312 and a second region 316. The first region 312 of the first contact 304 and the second contact 308 has a rectangular prism shape. The second region 316 of the first contact 304 and the second contact 308 also has a rectangular prism shape. In the example illustrated, the second region 316 has a larger volume than the first region 312. Also, the first region 312 of the first contact 304 is proximate the first corner 148 and the first region 312 of the second contact 308 is proximate the second corner 152. The second region 316 overlays the first region 312 of the first contact 304 and the second contact 308. The second region 316 of the first contact 304 is distal to the first corner 148 and the second region 316 of the second contact 308 is distal to the second corner 152.

The first region 312 and/or the second region 316 of the first contact 304 and the second contact 308 are formed of a metal, such as tungsten (W), aluminum (Al), copper (Cu) or some combination thereof. The first contact 304 and the second contact 308 are formed of material that is more rigid than material forming the PMD barrier 120 (e.g., silicon nitride) or the isolation dielectric 124 (e.g., silicon dioxide). Accordingly, the first contact 304 and the second contact 308 strengthen the first corner 148 and the second corner 152, respectively of the through trench 132. Thus, the first contact 304 and the second contact 308 resist movement from the application of the force in the direction of the arrow 182 due to thermal expansion of the polymer dielectric 404 (e.g. parylene) filling the through trench 132. Thus, the resistance to movement in the direction of the arrow 182 by the first contact 304 and the second contact 308 further curtails the chances that components of the metallization stack 116 (including the PO 128) will crack during solder reflow or another time that the die 300 is heated.

Figure 4:
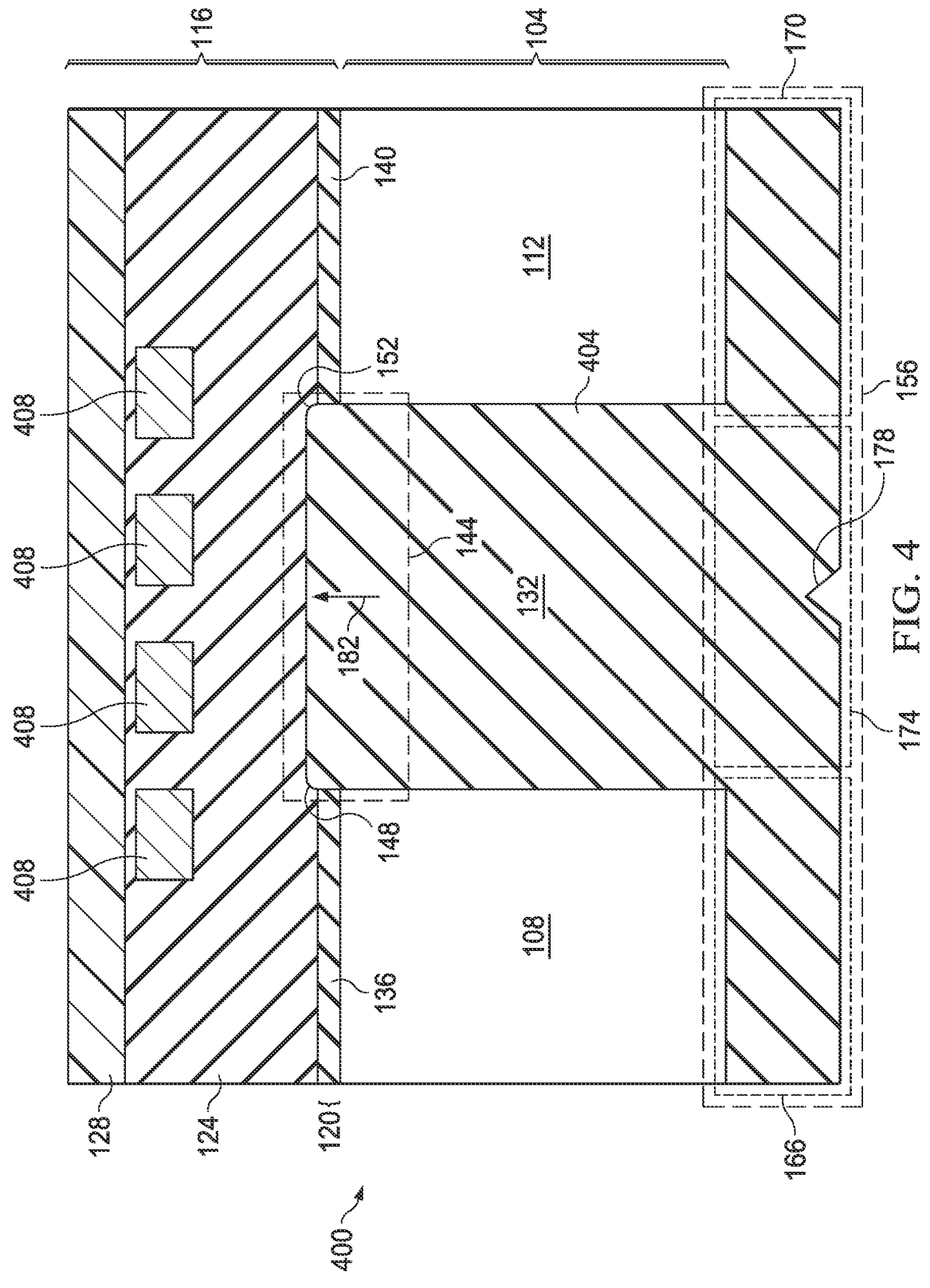
FIG. 4 illustrates a cross-section diagram of a region of a fourth example die employable for an IC package.

FIG. 4 illustrates a cross-section diagram of a region of a die 400 employable for an IC package. The die 400 has been singulated from a wafer, and is employable to implement the die 100 of FIG. 1. Thus, for simplicity, the same reference numbers are employed in FIGS. 1 and 4 to denote the same structure. Moreover, some features are not reintroduced.

In the example illustrated in FIG. 4, the through trench 132 is filled with a polymer dielectric 404 (e.g., parylene). Also, K number of dummy metal patches 408 are implanted in the isolation dielectric 124 (e.g., silicon dioxide), where K is an integer greater than or equal to one. Each of the dummy metal patches 408 are spaced apart from each other. Moreover, additional dummy metal patches 408 are offset (in and/or out of the diagram illustrated) from the dummy metal patches 408 illustrated in FIG. 4.

The dummy metal patches 408 are situated to extend over a length of the through trench 132. The dummy metal patches 408 add rigidity to the isolation dielectric 124 (e.g., silicon dioxide). Accordingly, inclusion of the dummy metal patches 408 causes the isolation dielectric 124 to resist transfer of force to the PO 128 in response to application of a force in the direction of the arrow 182 due to thermal expansion of the polymer dielectric 404 (e.g., parylene). Thus, the resistance to transfer of force in the direction of the arrow 182 by inclusion of the dummy metal patches 408 in the isolation dielectric 124 curtails the chances that components of the metallization stack 116 (including the PO 128) will crack during solder reflow or another time that the die 400 is heated.

Figure 5:
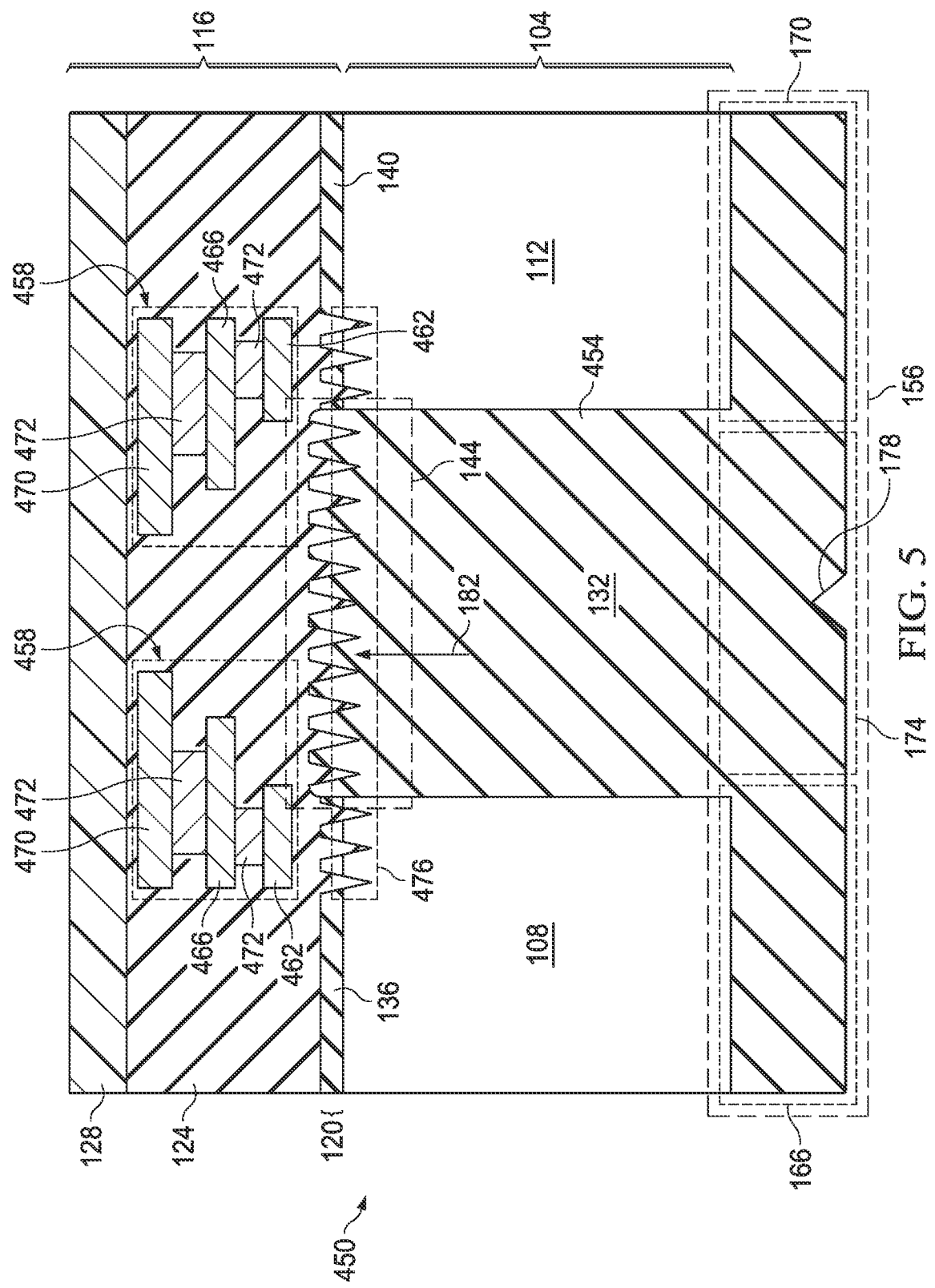
FIG. 5 illustrates a cross-section diagram of a region of a fifth example die employable for an IC package.

FIG. 5 illustrates a cross-section diagram of a region of a die 450 employable for an IC package. The die 450 has been singulated from a wafer, and is employable to implement the die 100 of FIG. 1. Thus, for simplicity, the same reference numbers are employed in FIGS. 1 and 5 to denote the same structure. Moreover, some features are not reintroduced.

In the example illustrated in FIG. 5, the through trench 132 is filled with a polymer dielectric 454 (e.g., parylene). Also, R number of tiered dummy metal patches 458 are placed in the isolation dielectric 124 (e.g., silicon dioxide), where R is an integer greater than or equal to one. Each of the tiered dummy metal patches 458 are spaced apart from each other. Each of the tiered dummy metal patches 458 includes two (2) or more layers of dummy metal patches having varying lengths. In the example illustrated, each tiered dummy metal patch 458 includes a first dummy metal patch 462, a second dummy metal patch 466 and a third dummy metal patch 470, but in other examples, there are more or less dummy metal patches in each tiered dummy metal patch 458. The first dummy metal patch 462 is proximate the PMD barrier 120 and the third dummy metal patch 470 is proximate the PO 128. In some cases the first dummy metal patch 462 is even wider than the trench such that the edge of the trench does not overlap this metal layer even due to intrinsic misalignment between the trench and this metal layer. The second dummy metal patch 466 is situated between the first dummy metal patch 462 and the third dummy metal patch 470. The tiered dummy metal patches 458 are situated to extend over a length of the through trench 132. Tiers (layers) of the tiered dummy metal patches 458 are connected with vias 472.

The first dummy metal patch 462 has a shortest length, the third dummy metal patch 470 has a longest length, and the second dummy metal patch 466 has a length between the length of the first dummy metal patch 462 and the third dummy metal patch 470. Accordingly, dummy metal patches of the tiered dummy metal patches 458 have different lengths. Thus, the third dummy metal patches 470 of two (2) different tiered dummy metal patches 458 are closer than the first dummy metal patches 462 of the same two (2) tiered dummy metal patches 458. Stated differently, a gap between the third dummy metal patches 470 of two (2) different tiered dummy metal patches 458 is narrower than a gap between the first dummy metal patches 462 of the same two (2) tiered dummy metal patches 458. The tiered dummy metal patches 458 add rigidity to the isolation dielectric 124 (e.g., silicon dioxide) because the dielectric strength of the isolation dielectric 124 (e.g., silicon dioxide) is greater than the dielectric strength of the polymer dielectric 454 (e.g., parylene). Also, the vias 472 add additional strength by tying the different tiers of the tiered dummy metal patches 458 together.

Further, the die 450 includes an array of shallow trench isolation features 476 that extends over the first end 144 of the trench 132. Stated differently, the array of shallow trench isolation features 476 extends over the trench 132. In some examples, the shallow trench isolation features 476 are only present near a center of the trench 132. In other examples, the shallow trench isolation features 476 extend to provide a specific overlap of the trench 132 (filled with the polymer dielectric 454) and the isolation dielectric 124. The array of shallow trench isolation features 476 are underneath but connected to the PMD barrier 120. The array of shallow trench isolation features 476 are filled with the isolation dielectric 124 such as silicon dioxide ($SiO_2$) and in some examples, the array of shallow trench isolation features 476 also include silicon nitride (SiN) or silicon oxynitride (SiON). The array of shallow trench isolation features 476 create a complicated surface topography in the interface of the polymer dielectric 454 and the isolation dielectric 124 to improve adhesion near the first end 144 of the polymer dielectric 454 and the isolation dielectric 124. The improvement in adhesion enables the polymer dielectric 454 to expand on heating and relax as heating increases without delamination. Further, as the polymer dielectric 454 cools, the polymer dielectric 454 is under tension and the rough surface provided by the array of shallow trench isolation features 476 increase surface area to keep the polymer dielectric 454 adhered to the isolation dielectric 124 near the first end 144 under an increase of a tensile load. In various examples, the array of shallow trench isolation features 476 have random sizes (perpendicular to a trench width) and random spacing. In some examples, the shallow trench isolation features 476 within regions of the trench 132 are smaller than the shallow trench isolation features 476 outside the trench 132, indicating that the shallow trench isolation features 476 have been partially etched. In some such examples, the shallow trench isolation features 476 follow an outline of the trench 132 and are longer in a first direction measured from the PMD barrier 120 toward the second region 170 of the trench 132 (e.g., a height) than a second direction perpendicular to the first direction (e.g., a width). Also, in some examples, the array of shallow trench isolation features 476 are selected to increase a surface area by reducing sizes of individual shallow trenches in the array of shallow trench isolation features 476.

Inclusion of the tiered dummy metal patches 458 and the array of shallow trenches causes the isolation dielectric 124 to resist transfer of force to the PO 128 in response to application of a force in the direction of the arrow 182 due to thermal expansion of the polymer dielectric 454 (e.g., parylene). Thus, the resistance to transfer of force in the direction of the arrow 182 by inclusion of the tiered dummy metal patches 458 in the isolation dielectric 124 and the array of shallow trench isolation features 476 further curtails the chances that components of the metallization stack 116 (including the PO 128) will crack during solder reflow or another time that the die 450 is heated.

Figure 6:
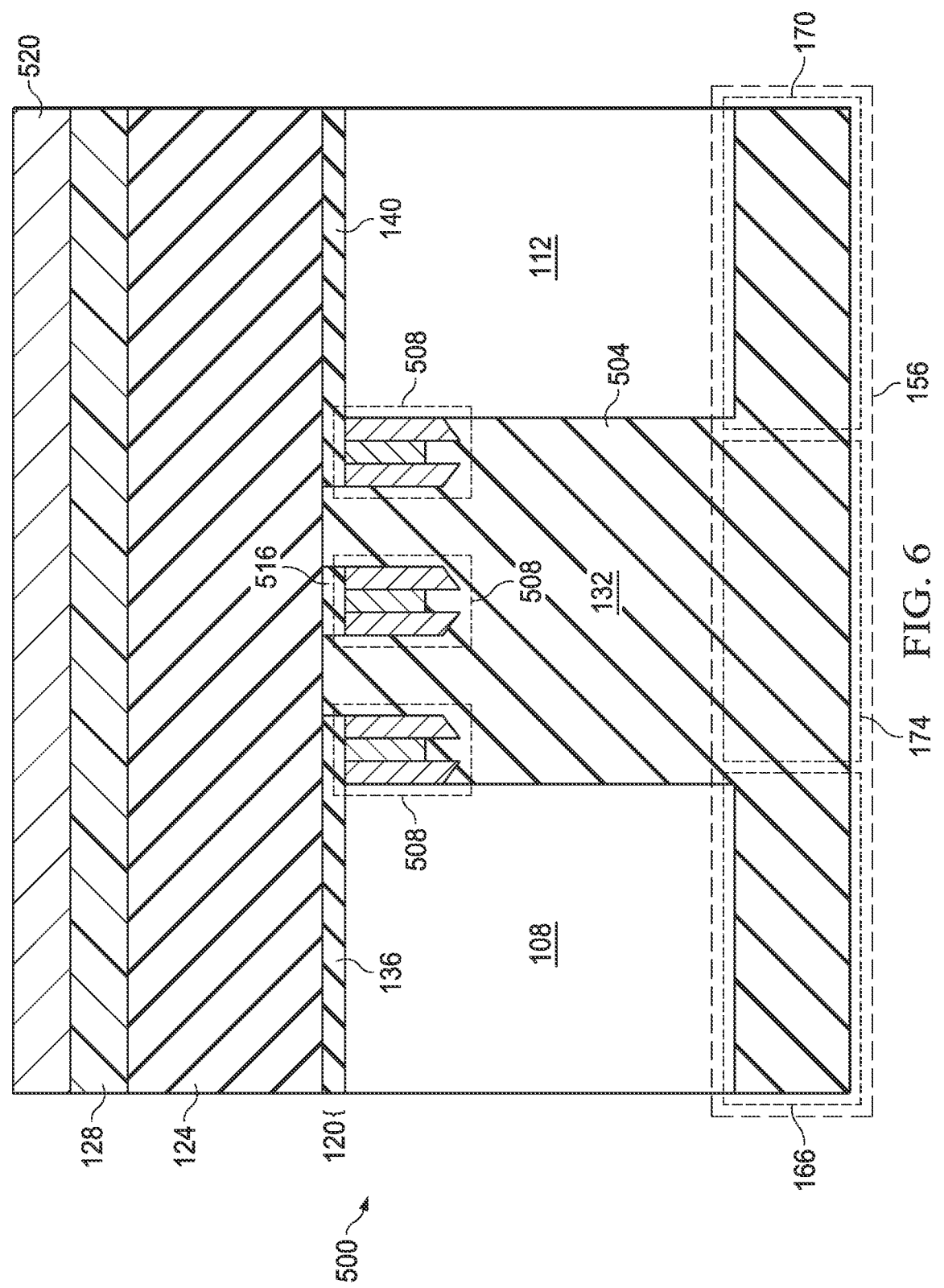
FIG. 6 illustrates a cross-section diagram of a region of a sixth example die employable for an IC package.

FIG. 6 illustrates a cross-section diagram of a region of a die 500 employable for an IC package. The die 500 has been singulated from a wafer, and is employable to implement the die 100 of FIG. 1. Thus, simplicity, the same reference numbers are employed in FIGS. 1 and 5 to denote the same structure. Moreover, some features are not reintroduced.

In the example illustrated in FIG. 6, the through trench 132 is filled with a polymer dielectric 504 (e.g., parylene). Also, R number of deep trenches 508, where R is an integer greater than or equal to one are situated in the through trench 132. The deep trenches 508 are situated at edges and/or a center of the through trench 132. In the example illustrated, there are three deep trenches 508, such that a deep trench 508 is situated over both edges and over a center of the through trench 132. In contrast to the array of shallow trench isolation features 476 of FIG. 4, the deep trenches 508 are deeper than the array of shallow trench isolation features 476. In various examples, the depth of the deep trenches 508 ranges from about 5 um to about 40 um. In some examples, the depth of the deep trenches 508 is less than a thickness of first region 108 and the second region 112 of the substrate. For instance, in one example, the depth of the deep trenches 508 is about 20% of a thickness of the first region 108 and the second region 112 of the substrate. In this example, the PMD barrier 120 includes portions that extend over each deep trench 508. In some such examples, the PMD barrier 120 includes a third region 516 that contacts a deep trench 508 situated in a middle of the through trench 132. In this situation, the polymer dielectric 504 fills in gaps between each deep trench 508 to improve electrical isolation and strength to the isolation dielectric 124.

Furthermore, in some examples, a metal layer 520 overlays the PO 128. The metal layer 520 improves the rigidity of the PO 128. Accordingly, adding the metal layer 520 increases the stress that is applicable to the PO 128 before the PO 128 cracks during solder reflow or another time that the die 500 is heated.

Figures 7, 8:
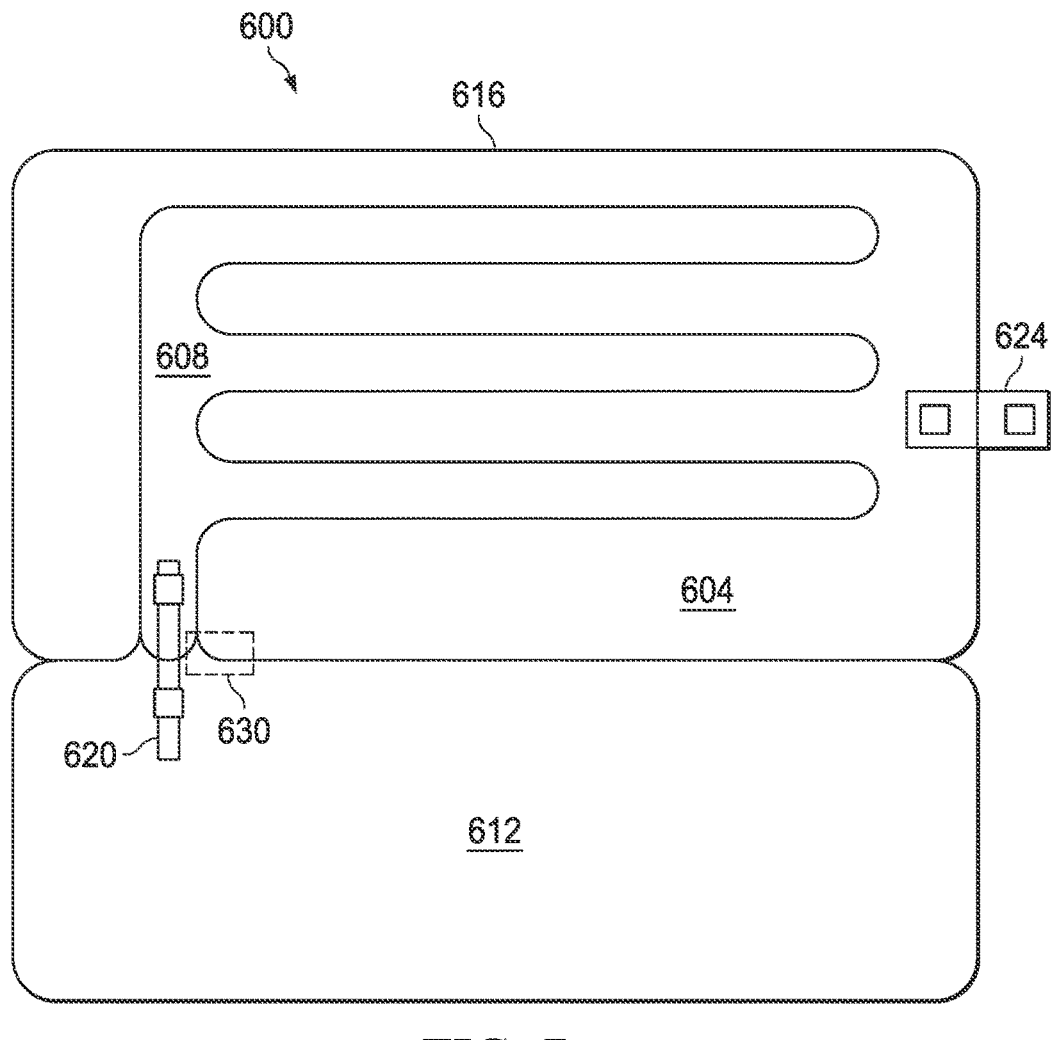
FIG. 7 illustrates an overhead view of a die employable for an IC package.
FIG. 8 illustrates three examples of architecture for a trench at a tripoint of a die of an IC package.

FIG. 7 illustrates an overhead view of a layout for a die 600 for an IC package. The die 600 includes a first region 604, a second region 608 and a third region 612. In some examples, the third region 612 has a high supply voltage, wherein components integrated with the third region 612 are rated for the high supply voltage. Conversely, in this example, the second region 608 has a low supply voltage (e.g., 10 V or less), and components in the second region 608 are rated for the low supply voltage. Further in this example, components in the first region 604 are rated for a third supply voltage (e.g., medium voltage) between the low supply voltage and the high supply voltage. A trench 616 electrically isolates the first region 604, the second region 608 and the third region 612 from each other. The trench 616 has a cross section corresponding to the cross section of the die 100 of FIG. 1, the die 200 of FIG. 2, the die 300 of FIG. 3, the die 400 of FIG. 4, the die 450 of FIG. 5 or the die 500 of FIG. 6. Thus the trench 616 is filled with a polymer dielectric (e.g., parylene).

In this example, a first coupling capacitor 620 electrically couples the second region 608 to the third region 612. In this manner, components in the second region 608 and the third region 612 communicate. Also, in this example, a second coupling capacitor 624 couples the first region 604 to an external region (not show) to enable communication between the die 600 to external components. The first coupling capacitor 620 and the second coupling capacitor 624 have a low parasitic capacitance (e.g., about 100 femtofarads or less). This type of capacitors can be used to transmit power as well as data. For power transmission the capacitor size is larger such as 200 fF and larger.

At certain locations of the layout of the die 600, the first region 604, the second region 608 and the third region 612 come near to form a tripoint such as a particular tripoint 630. Stated differently, at the tripoint 630 (a given location of the die 600), the first region 604, the second region 608 and the third region 612 are separated by the trench 616. There are multiple architectures for the trench 616 at such a junction.

Although the die 600 provides isolation with a single trench 616, in other examples, it is possible to increase the isolation failure and decrease the capacitance coupling between regions by providing multiple trenches. For example, it is possible to have two rows of trenches and a region (e.g., the third region 612) between the trenches connected to a ground connection with controlled parasitic capacitance and resistance to curtail noise coupling. In examples where both greater isolation and capacitance coupling are needed, providing multiple trenches takes additional areas and also employs additional perimeter to achieve the same capacitance due to an increase in a thickness of dielectric reducing a capacitance density.

FIG. 8 illustrates a first architecture 650, a second architecture 660 and a third architecture 670 for the trench 616 of FIG. 6 at a location with three (3) regions coming together, such as the tripoint 630 of FIG. 6. The first architecture 650 is referred to as a curved shaped connection. The second architecture 660 is referred to as a Y shaped connection and the third architecture 670 is referred to as a T shaped connection. Each of the first architecture 650 (the curved connection), the second architecture 660 (the Y shaped connection) and the third architecture 670 (the T shaped connection) create additional stress relative to a simple structure that has an elevated chance of mechanical failure due to cracking.

The second architecture 660 (the Y shaped connection) has a lowest stress and lowest chance of mechanical failure relative to the first architecture 650 (the curved connection) and the third architecture 670 (the T shaped connection) for a given width of the trench 616 of FIG. 7. The second architecture 660 (the Y shaped connection) has the lowest stress and the lowest chance of mechanical failure because the second architecture 660 has smoother corners than the first architecture 650 and the third architecture 670, which reduces mechanical stress. As one example, the second architecture 660 (the Y shaped connection) has 120 degree corners, and the third architecture 670 (the T shaped connection) has 90 degree corners. Moreover, the second architecture 660 is further enhanced by adding a rounded corner (e.g., a circle segment) with additional processing to widen an opening at the connection. In still further examples, dummy metal patches (e.g., the dummy metal patches 408 of FIG. 4 or the tiered dummy metal patches 458 of FIG. 5) are added to further increase a strength at the connections illustrated. Additionally or alternatively, additional polymer dielectric (e.g., parylene) is added at an edge of the trench, and at the corners of the connection.

Figure 9:
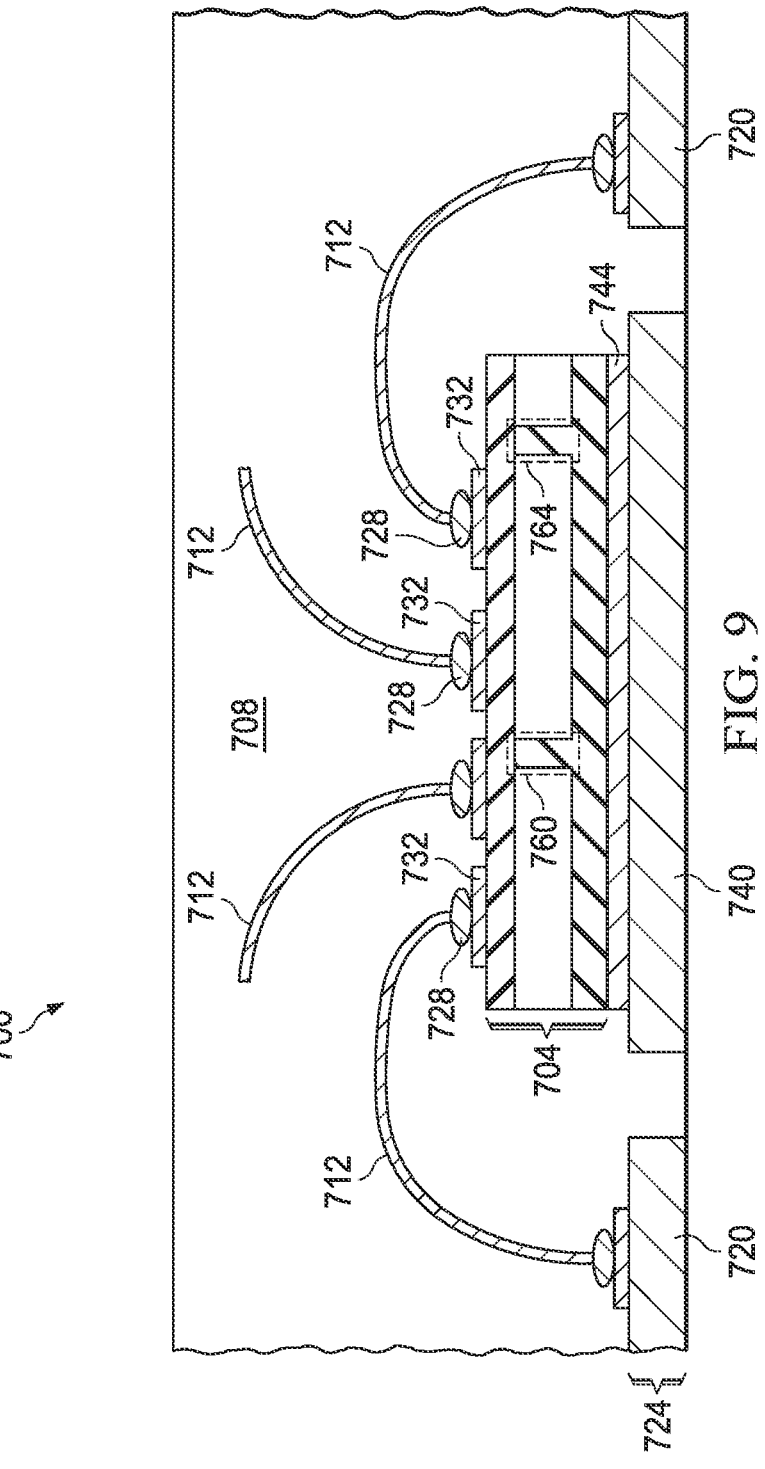
FIG. 9 illustrates an IC package that includes a die mounted in a first example IC package that is formed of a plastic molding material.

FIG. 9 illustrates an IC package 700 that includes a die 704 mounted in an IC package 708 that is formed of a plastic molding material. The die 704 is implemented with the die 200 of FIG. 2, the die 300 of FIG. 3, the die 400 of FIG. 4, the die 450 of FIG. 5 and/or the die 500 of FIG. 6. The IC package 708 is a wire bond package that includes a plurality of wire bonds 712. The wire bonds 712 electrically couple the die 704, such as a voltage region within the die 704 to a pad 720 of an interconnect 724 (alternatively referred to as a lead frame). The wire bonds 712 are coupled to the die 704 with a corresponding solder ball 728 that is formed on a conductive pad 732 formed on a first surface of the die 704.

A second surface of the die 704 that opposes the first surface of the die 704 is mounted on a pad 740 of the interconnect 724 (e.g., a center pad). More specifically, a die attach material 744 (e.g., solder paste) is sandwiched between the pad 740 of the interconnect 724 and the second surface of the die 704.

The die 704 includes a first trench 760 and a second trench 764 that separate regions of the die 704. In some examples, the first trench 760 and the second trench 764 are employable to implement the through trench 132 of FIGS. 1-6. These regions of the die 704 that are separated by the first trench 760 and/or the second trench 764 are employable to implement different voltage levels, as describe herein.

Figure 10:
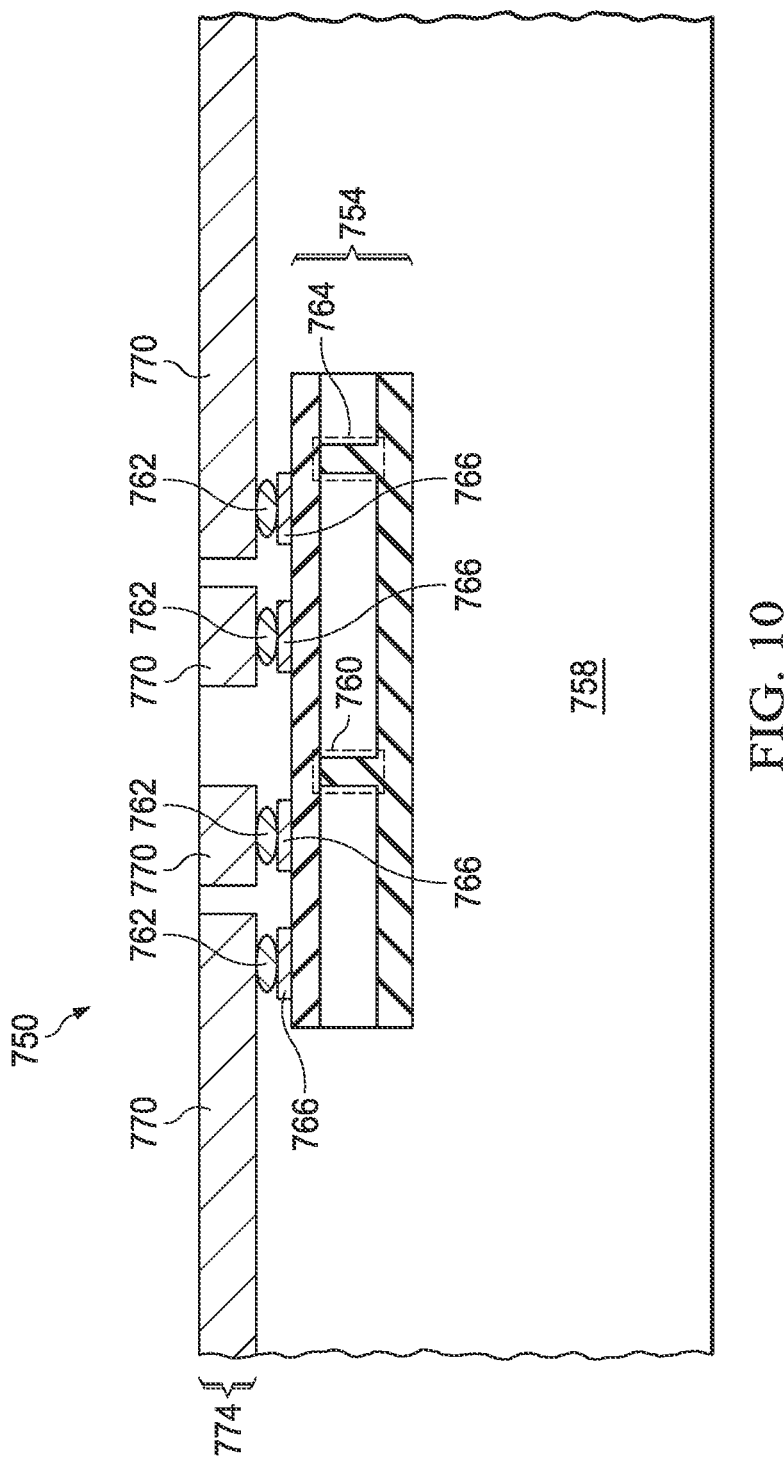
FIG. 10 illustrates an IC package that includes a die mounted in a second example IC package that is formed of a plastic molding material.

FIG. 10 illustrates an IC package 750 that includes a die 754 mounted in an IC package 758 that is formed of a plastic molding material. The die 754 is implemented with the die 200 of FIG. 2, the die 300 of FIG. 3, the die 400 of FIG. 4 and/or the die 500 of FIG. 6. The IC package 758 is a solder to interconnect package that includes a plurality of solder balls 762 coupled to a surface of the die 754. The solder ball 762 are coupled to metal contacts 766 (e.g., formed of aluminum or copper) mounted on the surface of the die 754 and to pads 770 of an interconnect 774.

The die 754 includes a first trench 760 and a second trench 764 that separate regions of the die 754. In some examples, the first trench 760 and the second trench 764 are employable to implement the through trench 132 of FIGS. 1-5. These regions of the die 754 that are separated by the first trench 760 and/or the second trench 764 are employable to implement different voltage levels, as describe herein.

Figure 11:
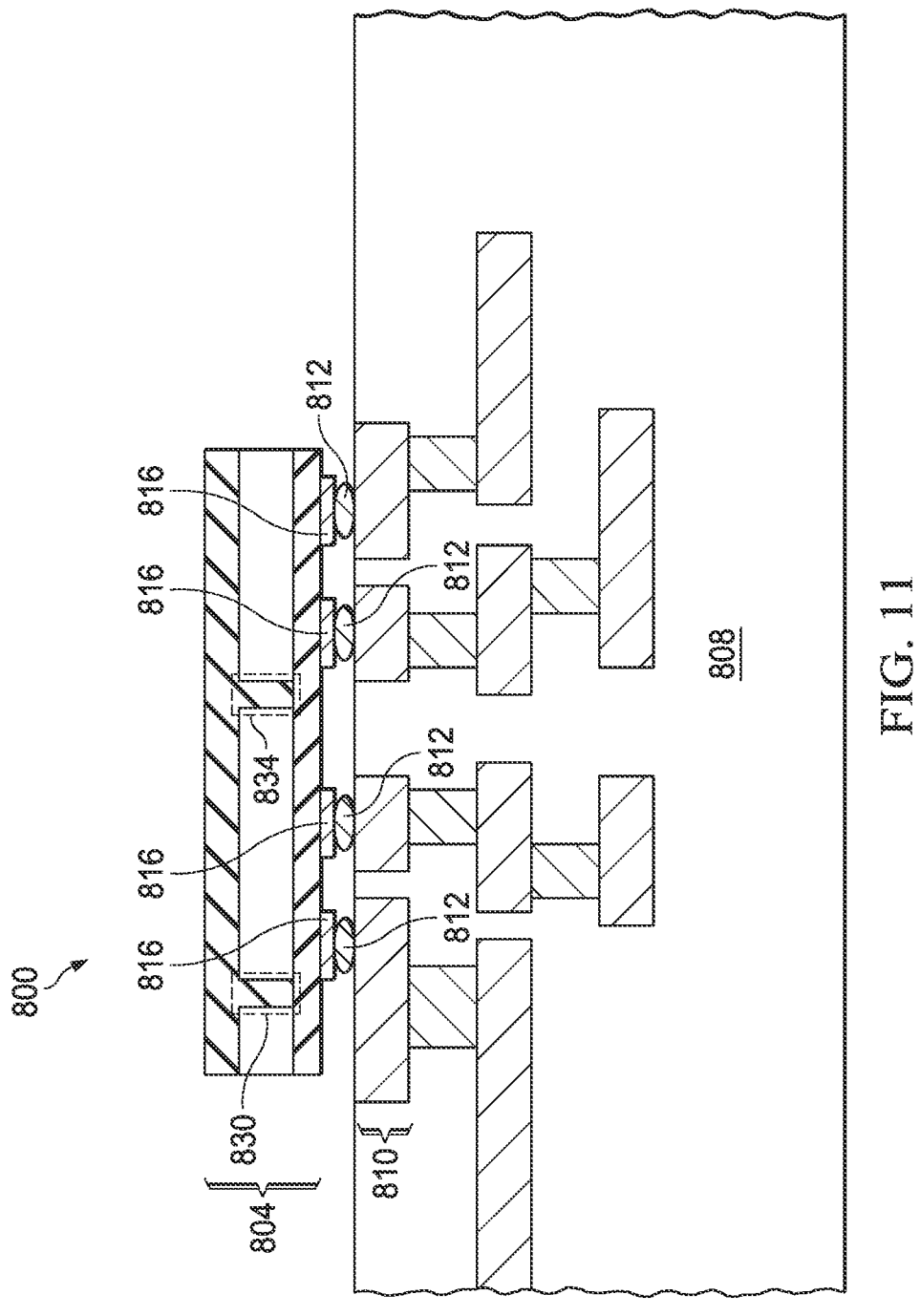
FIG. 11 illustrates an IC package that includes a die mounted on a printed circuit board (PCB).

FIG. 11 illustrates an IC package 800 that includes a die 804 mounted on a printed circuit board (PCB) 808. In some such an examples, the die 804 is encased in a molding material (not shown) and mounted on the PCB 808 prior to singulation. The die 804 is implemented with the die 200 of FIG. 2, the die 300 of FIG. 3, the die 400 of FIG. 4, the die 450 of FIG. 5 and/or the die 500 of FIG. 6. The die 804 is coupled to pads 810 of the PCB 808 through a plurality of solder balls 812 coupled to a first surface of the die 804. The solder balls 812 are coupled to metal contacts 816 (e.g., formed of aluminum) mounted on the first surface of the die 804 and to pads 810 of the PCB 808. The pads 810 are coupled to vias within the PCB 808. In some examples, the IC package 800 includes an additional polymer layer (not shown) between the die 804 and the PCB 808 to increase the mechanical properties and improve a voltage rating between different bump regions. This polymer layer is sometimes referred to as an underfill application.

The die 804 includes a first trench 830 and a second trench 834 that separate regions of the die 804. In some examples, the first trench 830 and the second trench 834 are employable to implement the through trench 132 of FIGS. 1-6. These regions of the die 804 that are separated by the first trench 830 and/or the second trench 834 are employable to implement different voltage levels, as describe herein.

FIGS. 9-11 illustrate different ways that a die, such as the die 100 of FIG. 1, the die 200 of FIG. 2, the die 300 of FIG. 3, the die 400 of FIG. 4, the die 450 of FIG. 5 and/or the die 500 of FIG. 6 is mounted in a package to form an IC package. As demonstrated in FIGS. 9-11, the dies illustrated throughout this description are process agnostic.

FIGS. 12-19 illustrate stages of a method of processing a wafer for singulation of dies, such as the die 100 of FIG. 1, the die 200 of FIG. 2, the die 300 of FIG. 3, the die 400 of FIG. 4, the die 450 of FIG. 5 and/or the die 500 of FIG. 6 is mounted in a package to form an IC package, such as the IC package 700 of FIG. 9, the IC package 750 of FIG. 8 or the IC package 800 of FIG. 11. The method of FIGS. 12-19 illustrates how the wafer is processed to add through trenches for isolation trenches.

Figure 12:
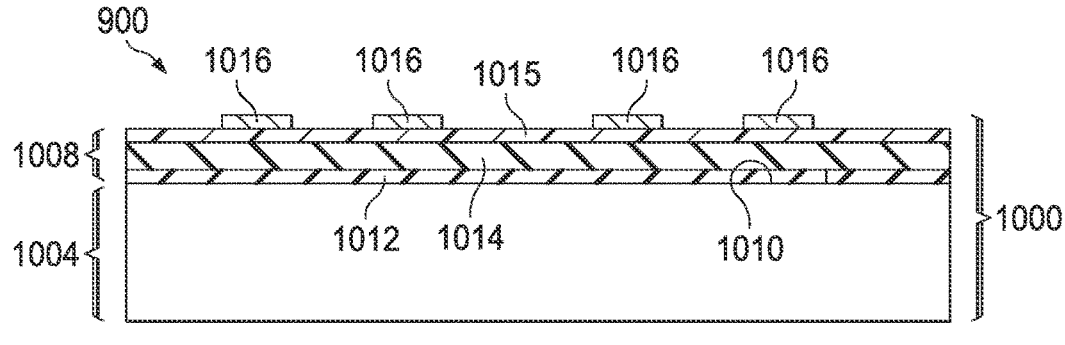
FIG. 12 illustrates a first stage of a method for processing a wafer for singulation of dies.

In a first stage of the method, as illustrated in FIG. 12 at 900, a wafer 1000 is provided. The wafer 1000 includes a substrate 1004 that has circuit components (e.g., transistors, resistors and/or capacitors embedded) therein. A metallization stack 1008 is situated on a first surface 1010 of the substrate 1004. The metallization stack 1008 includes a PMD barrier 1012 formed of a dielectric material, such as silicon nitride (SiN), and an isolation dielectric 1014, such as silicon dioxide ($SiO_2$). The metallization stack 1008 also includes a protective overcoat 1015. Moreover, conductive pads 1016 that are formed of a metal, such as aluminum (Al) are formed on the metallization stack 1008.

Figure 13:
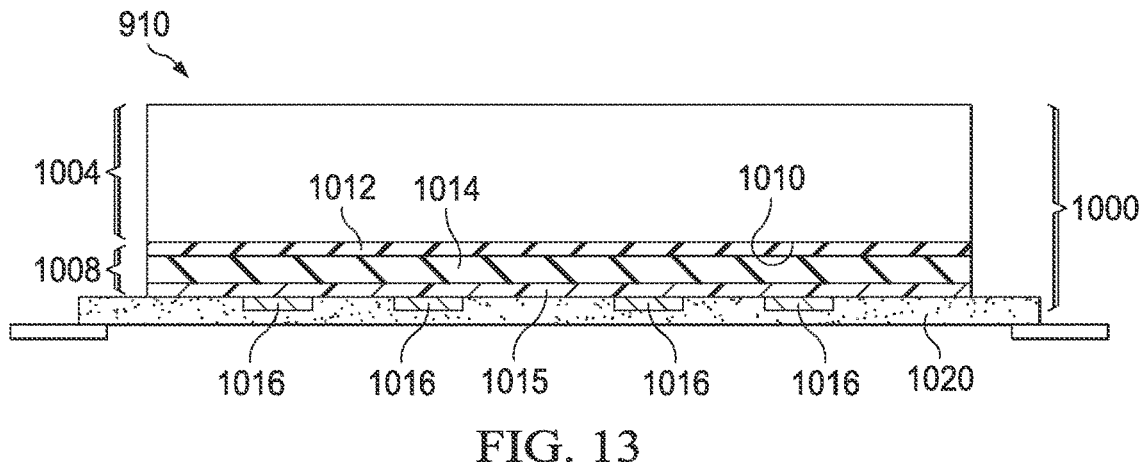
FIG. 13 illustrates a second stage of the method for processing a wafer for singulation of dies.
Figure 14:
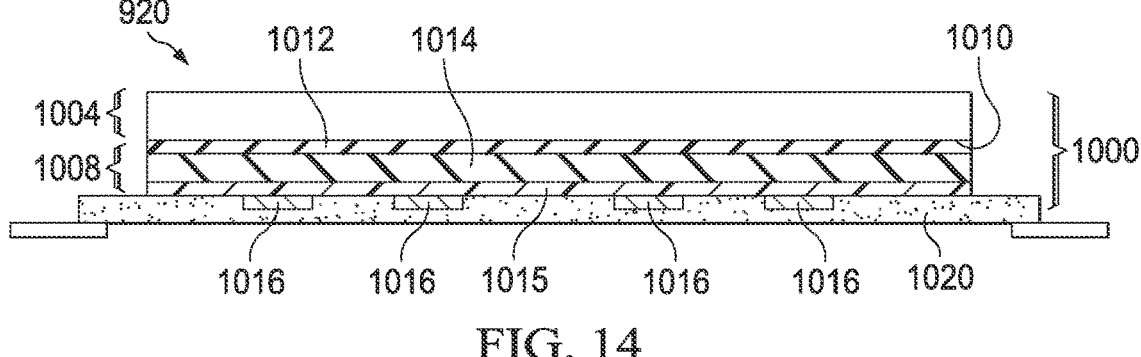
FIG. 14 illustrates a third stage of the method for processing a wafer for singulation of dies.
Figure 15:
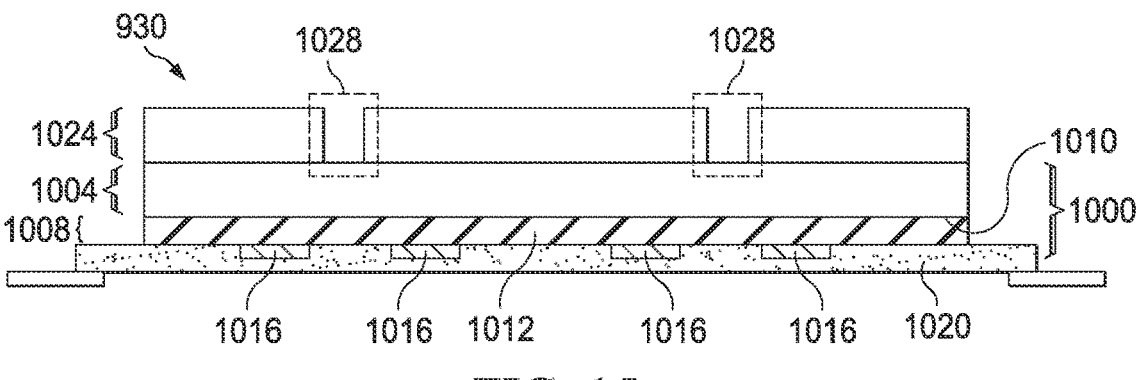
FIG. 15 illustrates a fourth stage of the method for processing a wafer for singulation of dies.
Figure 16:
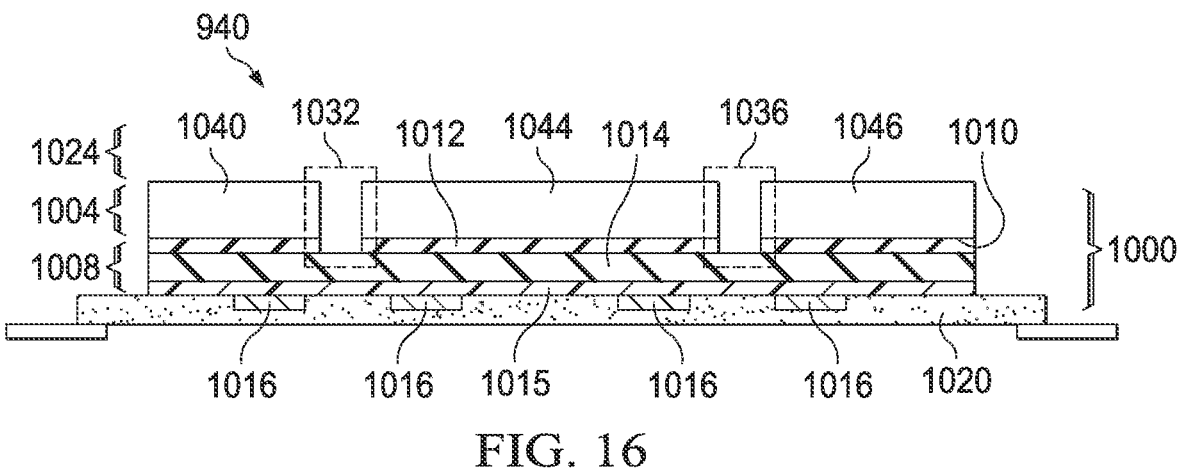
FIG. 16 illustrates a fifth stage of the method for processing a wafer for singulation of dies.

In a second stage of the method, as illustrated in FIG. 13, at 910, the wafer 1000 is flipped an adhesive tape 1020 is adhered to the wafer 1000 for further processing. In a third stage of the method, as illustrated in FIG. 14, at 920, the substrate 1004 is ground and polished to a thickness of about 80 to about 1020 micrometers (μm). In a fourth stage of the method, as illustrated in FIG. 15, at 930 a coating of resist 1024 is patterned on the wafer 1000. The coating of resist 1024 includes gaps 1028 the facilitate forming of through trenches. More particularly, in a fifth stage of the method, as illustrated in FIG. 16 at 940, a first through trench 1032 and a second through trench 1036 are etched in the substrate 1004 and the resist 1024 is removed. The first through trench 1032 and the second through trench 1036 are etched sufficiently to expose the metallization stack 1008. More particularly, the PMD barrier 1012 of the metallization stack 1008 is etched and a relatively small portion of the isolation dielectric is also etched, such that the first through trench 1032 and the second through trench 1036 protrude into the isolation dielectric 1014. As a result of the etching of the substrate 1004, the substrate 1004 is separated into regions, namely a first region 1040, a second region 1044 and a third region 1046. It is possible to deposit an additional dielectric such as SiO2, SiON or SiN or AlOx after trench formation and before polymer fill as described above in connection with FIG. 2.

Figure 17:
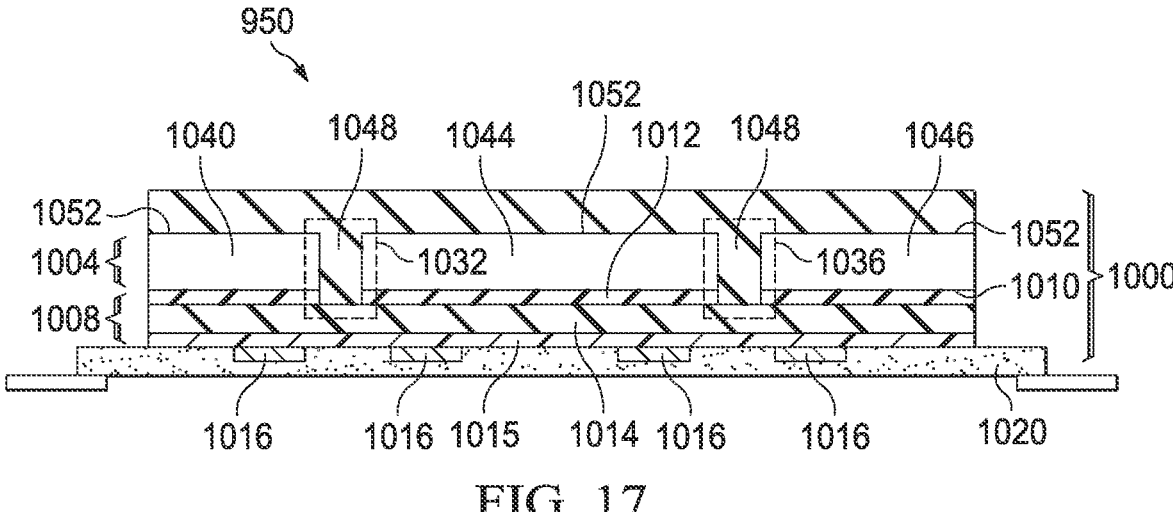
FIG. 17 illustrates a sixth stage of the method for processing a wafer for singulation of dies.

In a sixth stage of the method, as illustrated in FIG. 17, at 950, a polymer dielectric 1048, such as parylene is applied to the wafer 1000. The polymer dielectric 1048 fills the first through trench 1032 and the second through trench 1036, and forms a layer overlaying a second surface 1052 of the substrate 1004, wherein the second surface 1052 opposes the first surface 1010. Also, at 950, additional processing actions are also included in some examples. For instance, in some examples, voids (e.g., the void 212 of FIG. 2) in the first through trench 1032 and the second through trench 1036 are formed.

Figure 18:
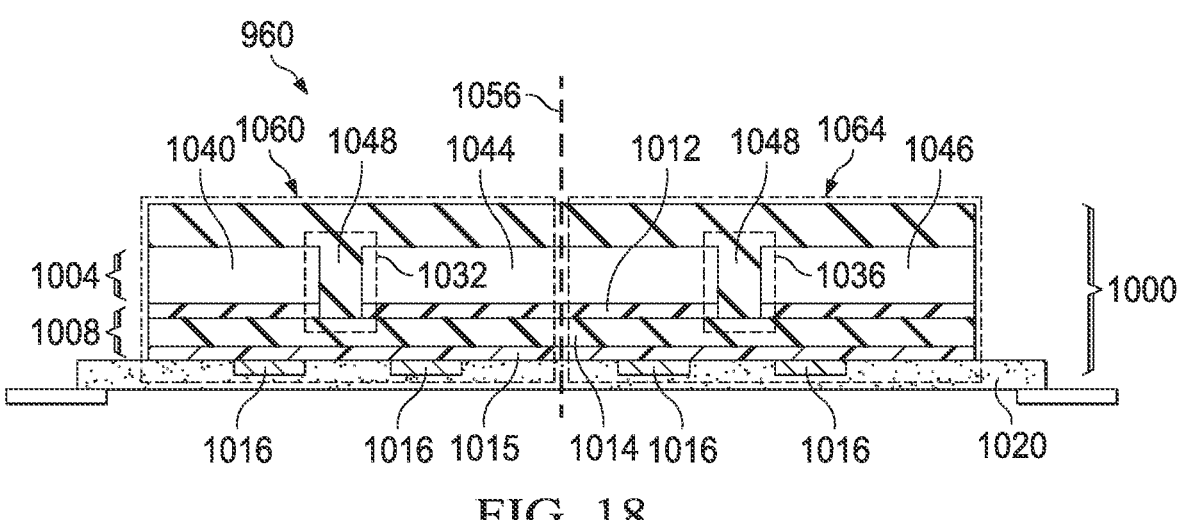
FIG. 18 illustrates a seventh stage of the method for processing a wafer for singulation of dies.

In a seventh stage of the method, as illustrated in FIG. 18, at 960, the second region 1044 of the substrate 1004 is cut at a location 1056 to singulate a first die 1060 and a second die 1064. In various examples, the wafer 1000 is cut at the location 1056 by a saw, a laser, an ion beam or a plasma cutter. The first die 1060 and/or the second die 1064 are employable to implement the die 100 of FIG. 1, the die 200 of FIG. 2, the die 300 of FIG. 3, the die 400 of FIG. 4, the die 450 of FIG. 5 or the die 500 of FIG. 6. In some examples, the first region 1040 of the first die 1060 and the third region 1046 of the second die 1064 have embedded components rated for different voltage levels than the second region 1044 (split between the first die 1060 and the second die 1064).

Figure 19:
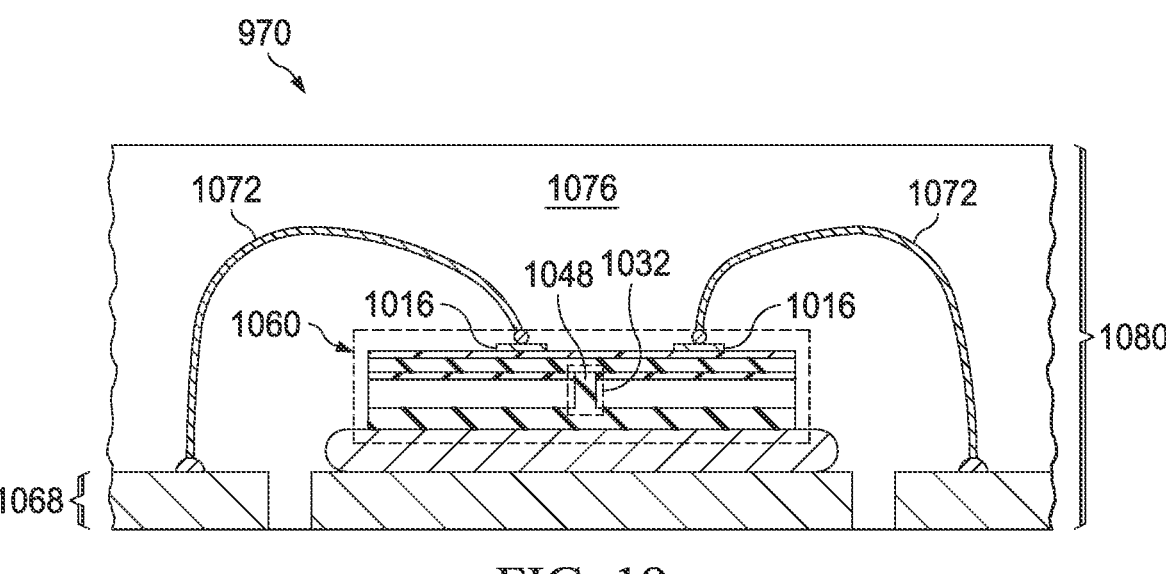
FIG. 19 illustrates an eighth stage of the method for processing a wafer for singulation of dies.

In an eighth stage of the method, as illustrated in FIG. 19, at 970, the first die 1060 is flipped and mounted on an interconnect 1068 (e.g., a lead frame). Also, at 970, wire bonds 1072 couple pads of the interconnect 1068 to the conductive pads 1016 of the first die 1060. Further at 970, the first die 1060 and the interconnect 1068 are encased in a molding 1076 formed of plastic to form an IC package 1080. To mount the first die 1060 on the interconnect 1068 and attach the wire bonds 1072, the first die 1060 is heated for solder reflow. However, because the PMD barrier 1012 has been etched, force caused by thermal expansion of the polymer dielectric 1048 is not transferred to the protective overcoat 1015 through the PMD barrier 1012. Accordingly, the chances of cracking the protective overcoat 1015 during such solder reflow are reduced.

Figure 20:
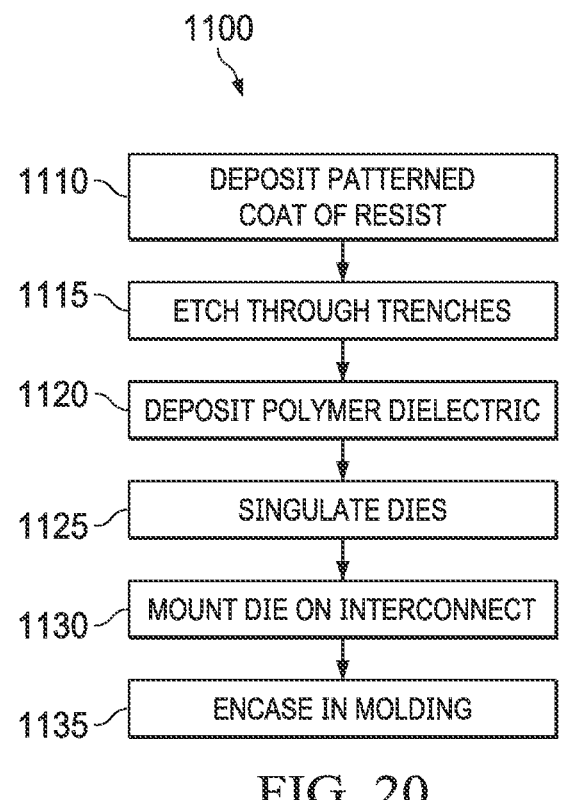
FIG. 20 illustrates a flowchart of an example method for forming an IC package.

FIG. 20 illustrates a flowchart of an example method 1100 for forming an IC package. At 1110, a patterned coat of resist is deposited on a wafer (e.g., the wafer 1000 of FIGS. 12-18). A metallization stack (e.g., the metallization stack 116 of FIG. 1) is situated on a first surface of the wafer. The metallization stack includes a PMD barrier (e.g., the PMD barrier 120 of FIG. 1) and an isolation dielectric (e.g., the isolation dielectric 124 of FIG. 1).

At 1115 through trenches (e.g., the through trench 132 of FIG. 1) are etched in the wafer, such that the through trench protrudes into the isolation dielectric of the metallization stack and the coat of resist is removed. At 1120, a polymer dielectric (e.g., parylene) is deposited on a second surface of the wafer to fill the through trenches. At 1125, dies are singulated from the wafer, such that the dies include a through trench. At 1130, a die of the singulated dies is mounted on an interconnect (e.g. the interconnect 1068 of FIG. 19). At 1135, the die and the interconnect are encased in a molding (e.g., the molding 1076 of FIG. 19).

Modifications are possible in the described embodiments, and other embodiments are possible, within the scope of the claims.

What is claimed is:

1. A device comprising:

a lead frame including a die pad;

a substrate having opposing first and second surfaces and including a through trench that extends between the first and second surfaces, the through trench filled with a first dielectric material, a first region and a second region of the substrate being spaced apart by the through trench and the first dielectric material, and the first dielectric material extends onto and covering the first surface and is between the first surface and the die pad;

a pre-metal barrier layer abutting the second surface of the substrate, the barrier layer having a first region on the first region of the substrate and a second region on the second region of the substrate, the first region and the second region of the barrier layer being spaced apart by the through trench and the first dielectric material;

a layer of a second dielectric material on and abutting the barrier layer and the through trench, and the first dielectric material, in which the first dielectric material extends partially into the layer of the second dielectric material;

a metallization structure surrounded by the second dielectric material; and a layer of a third dielectric material overlapping the layer of the second dielectric material.

2. The device of claim 1, wherein an end of the through trench proximate the layer of the second dielectric material comprises rounded corners.

3. The device of claim 2, wherein the first dielectric material has a first coefficient of thermal expansion, the barrier layer includes a material with a second coefficient of thermal expansion, the first coefficient of thermal expansion being greater than the second coefficient of thermal expansion.

4. The device of claim 2, wherein the barrier layer includes silicon nitride, and the first dielectric material includes parylene.

5. The device of claim 2, further comprising metal patches in the layer of the second dielectric material.

6. The device of claim 2, wherein the end of the through trench is a first end, the through trench further comprising a notch at a second end of the through trench distal from the first end.

7. The device of claim 1, further comprising:

multiple layers of metal patches of varying lengths in the layer of the second dielectric material and over the through trench.

8. The device of claim 1, wherein the substrate further comprises a third region spaced apart from the first region and the second region, and the through trench traverses a location on the substrate where the first region, the second region and the third region are separated by the through trench.

9. The device of claim 8, wherein the through trench at the location is one of a curved shaped connection and a Y shaped connection.

10. The device of claim 1, wherein the layer of the third dielectric material is a protective overcoat.

11. The device of claim 1, wherein the barrier layer and the layer of the third dielectric material are of a same dielectric material.

12. The device of claim 1, further comprising trenches or recesses proximate an interface between the through trench and the layer of the second dielectric material.

13. The device of claim 1, wherein the barrier layer is on and abutting the second surface.

14. The device of claim 1, wherein the first region includes first circuitry, the second region includes second circuitry, and the first and second circuitries are in different power domains.

15. The device of claim 1, further comprising:

an encapsulation material covering the lead frame, the substrate, the barrier layer, the second dielectric material, the metallization structure, and the layer of the third dielectric material.

\* \* \* \* \*